United States Patent
Kim et al.

(10) Patent No.: US 11,066,601 B2
(45) Date of Patent: *Jul. 20, 2021

(54) COMPOSITION FOR ETCHING, METHOD FOR ETCHING INSULATOR AND METHOD FOR MANUFACTURING SEMICONDUCTOR DEVICE, AND NOVEL COMPOUNDS

(71) Applicants: SK Innovation Co., Ltd., Seoul (KR); SK-Materials Co., Ltd., Yeongju-si (KR)

(72) Inventors: Cheol Woo Kim, Daejeon (KR); Min Kyung Seon, Daejeon (KR); Yu Na Shim, Daejeon (KR); Jae Hoon Kwak, Yeongju-si (KR); Young Bom Kim, Yeongju-si (KR); Jong Ho Lee, Yeongju-si (KR); Jin Kyung Jo, Yeongju-si (KR)

(73) Assignees: SK Innovation Co., Ltd., Seoul (KR); SK-Materials Co., Ltd., Yeongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/886,944

(22) Filed: May 29, 2020

(65) Prior Publication Data
US 2020/0377793 A1    Dec. 3, 2020

(30) Foreign Application Priority Data
May 30, 2019 (KR) ........................ 10-2019-0063737

(51) Int. Cl.
C09K 13/06 (2006.01)
C07F 7/18 (2006.01)
H01L 21/4757 (2006.01)

(52) U.S. Cl.
CPC ............ *C09K 13/06* (2013.01); *C07F 7/1804* (2013.01); *H01L 21/47573* (2013.01)

(58) Field of Classification Search
None
See application file for complete search history.

(56) References Cited

U.S. PATENT DOCUMENTS

2020/0131439 A1* 4/2020 Kim .................. H01L 21/31111

* cited by examiner

*Primary Examiner* — Roberts P Culbert
(74) *Attorney, Agent, or Firm* — Oblon, McClelland, Maier & Neustadt, L.L.P.

(57) ABSTRACT

An etching composition contains phosphoric acid, phosphoric anhydride, a compound represented by the following Formula 1, and a silane compound comprising at least one silicon (Si) atom, excluding the compound represented by Formula 1:

[Formula 1]

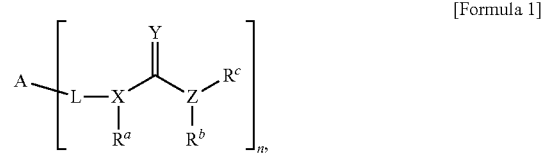

wherein, in Formula 1, A is an n-valent radical, where n is an integer of 1 to 6, L is a direct bond or hydrocarbylene, Y is selected from $NR^1$, O, $PR^2$ and S, where $R^1$ to $R^2$ are independently hydrogen, halogen, a substituted or unsubstituted hydrocarbyl group, or non-hydrocarbyl group, X and Z are independently selected from N, O, P and S, and $R^a$ to $R^c$ are independently an unshared electron pair, hydrogen, or a substituted or unsubstituted hydrocarbyl group.

14 Claims, 1 Drawing Sheet

COMPOSITION FOR ETCHING, METHOD FOR ETCHING INSULATOR AND METHOD FOR MANUFACTURING SEMICONDUCTOR DEVICE, AND NOVEL COMPOUNDS

CROSS-REFERENCE TO RELATED APPLICATION(S)

This application claims benefit of priority to Korean Patent Application No. 10-2019-0063737 filed on May 30, 2019 in the Korean Intellectual Property Office, the disclosure of which is incorporated herein by reference in its entirety.

BACKGROUND

1. Field

The present disclosure relates to an etching composition, particularly, to an etching composition having a high selection ratio and capable of selectively removing a nitride film while minimizing an etching rate of an oxide film, a method of etching an insulator film, and a method of manufacturing a semiconductor device to which the etching method is applied. Furthermore, the present disclosure relates a silane compound appropriate for being used as an additive of the etching composition.

2. Description of Related Art

An oxide film, such as a silicon oxide ($SiO_2$) film, and a nitride film, such as a silicon nitride (SiNx), film are representative insulating films, and in a semiconductor manufacturing process, the silicon oxide film or the silicon nitride film is used alone or in a form in which one or more films are alternately stacked. In addition, the oxide film or the nitride film is also used as a hard mask for forming a conductive pattern such as a metal wiring.

In a wet etching process for removing the nitride film, a mixture of phosphoric acid and deionized water is generally used. The deionized water is added for preventing a decrease in an etching rate and a change in etching selectivity of the nitride film to an oxide film; however, there is a problem in that defects arise in a nitride film etching removal process even with a minute change in an amount of supplied deionized water. In addition, phosphoric acid is a strong acid and corrosive, thereby leading to difficulties in handling.

In order to solve such problems, there is a conventionally known technology for removing a nitride film using an etching composition containing fluoric acid (HF), nitric acid ($HNO_3$), or the like, in phosphoric acid ($H_3PO_4$). This technology, however, results in reducing an etching selection ratio of the nitride film and the oxide film. Further, there is also a known technology of removing a nitride film using phosphoric acid and a silicate, or an etching composition containing silicic acid. However, the silicic acid or silicate has a problem of generating particles which may affect a substrate, thereby being inappropriate for a semiconductor manufacturing process.

In the meantime, when phosphoric acid is used in a wet etching process for removing the nitride film, not only the nitride film but also an SOD oxide film may be etched due to a reduced etching selection ratio between the nitride film and the oxide film, whereby it is difficult to adjust an effective field oxide height (EFH). Accordingly, a sufficient wet etching time for removing the nitride film may not be secured, or an additional process may be needed, causing a change in device characteristics and having adverse effects thereon.

Therefore, an etching composition having a high selection ratio, which selectively etches a nitride film to an oxide film and does not have a problem such as particle generation in a semiconductor manufacturing process, is currently demanded.

Meanwhile, a silane-based additive, which is an additive added to a conventional etching composition, has solubility too low to secure optimal solubility, thereby causing precipitation of particles in the etching solution composition and abnormal growth of a substrate. Such particles may remain on a silicon substrate, resulting in a defect of a device implemented thereon, or in failure of equipment used in an etching process or a washing process.

SUMMARY

An aspect of the present disclosure is to provide an etching composition having a high selection ratio, which can selectively remove a nitride film while minimizing an etching rate of an oxide film, without causing problems such as particle generation having adverse effects on device characteristics.

Another aspect of the present disclosure is to provide an etching composition having excellent storage stability.

Still another aspect of the present disclosure is to provide an etching method of an insulator film using the etching composition and a method for manufacturing a semiconductor device.

According to an aspect of the present disclosure, an etching composition contains phosphoric acid, phosphoric anhydride, a compound represented by the following Formula 1, and a silane compound comprising at least one silicon (Si) atom, excluding the compound represented by Formula 1:

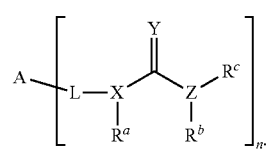

[Formula 1]

In Formula 1, A is an n-valent radical, where n is an integer of 1 to 6, L is a direct bond or hydrocarbylene, Y is selected from $NR^1$, O, $PR^2$ and S, where $R^1$ to $R^2$ are independently hydrogen, halogen, a substituted or unsubstituted hydrocarbyl group, or non-hydrocarbyl group, X and Z are independently selected from N, O, P and S, and $R^a$ to $R^c$ are independently an unshared electron pair, hydrogen, or a substituted or unsubstituted hydrocarbyl group.

$R^a$ to $R^c$ may be independently selected from an unshared electron pair, hydrogen, or a substituted or unsubstituted $C_1$-$C_{20}$ hydrocarbyl group, a substituted or unsubstituted $C_6$-$C_{20}$ aryl group, and a functional group represented by the following formula:

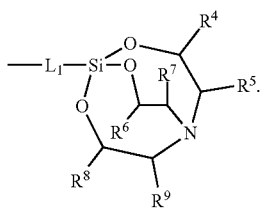

In the formula above, $R^4$ to $R^9$ are independently hydrogen, a substituted or unsubstituted hydrocarbyl group, or a non-hydrocarbyl group; for example, $R^4$ to $R^9$ may be all hydrogen. $L_1$ may be a direct bond or hydrocarbylene; for example, $L_1$ may be $C_1$-$C_{10}$ alkylene.

In Formula 1 above, A is hydrocarbyl, hydrocarbylene, a radical having N as a binding site, a radical having O as a binding site, a radical having S as a binding site, or a radical having P as a binding site.

As an exemplary embodiment, A may be $C_1$-$C_{20}$ alkyl or $C_6$-$C_{20}$ aryl. A may independently exist or may be connected to $R^a$ via a heteroatom of oxygen (O), nitrogen (N) or sulfur (S) to form a ring.

As an exemplary embodiment, A may be *—$(CH_2)_pR^{10}$ (p is an integer of 0 to 3, $R^{10}$ is hydrogen (p is not 0), halogen (p is not 0), a substituted or unsubstituted $C_1$-$C_{20}$ alkyl group, a substituted or unsubstituted $C_6$-$C_{20}$ aryl group, a substituted or unsubstituted $(C_1$-$C_{20})$alkyl$(C_1$-$C_{20})$alkoxy group, or *—$(CH=CH)_mN=$ (connected to $R^a$ via N to form a ring; m is an integer of 1 to 3). For example, A may be *—$CH_3$,

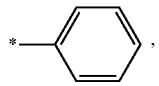

*—CH=CHN= (connected to $R^a$ via N to form a ring),

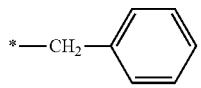

or *—$(CH_2)_2$—$OCH_3$.

As an exemplary embodiment, A may be a bivalent to hexavalent radical, represented by

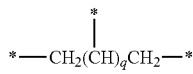

(q is an integer of 0 to 4), for example,

As an exemplary embodiment, the radical having N as a binding site may be *—$NR^{11}R^{12}$, *—$NR^{13}$—*,

*—$NR^{14}CSNR^{15}$—*, *—$NR^{16}CONR^{17}$—*, *—$NR^{18}L_2NR^{19}$—*, *—$NR^{20}CONR^{21}L_3NR^{22}CONR^{23}$—*, *—N$R^{24}CONL_4L_5NCONR^{25}$—*,

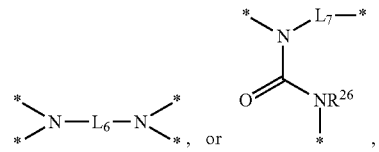

where $R^{11}$ to $R^{26}$ are independently hydrogen, a $C_1$-$C_{20}$ alkyl group or a $C_6$-$C_{20}$ aryl group, and $L_2$ to $L_6$ are $C_1$-$C_{20}$ alkylene, $C_6$-$C_{20}$ arylene, or $R^{31}(OR^{32})_r$ ($R^{31}$ and $R^{32}$ are independently $C_1$-$C_{20}$ alkylene, and r is an integer of 1 to 5), and $L_7$ is a direct bond or $(CH_2)_sNR^{33}NR^{34}$ ($R^{33}$ and $R^{34}$ are independently hydrogen, a $C_1$-$C_{20}$ alkyl group or a $C_6$-$C_{20}$ aryl group, and s is an integer of 1 to 5). For example, the radical having N as a binding site may be *—$NR^{11}R^{12}$, *—$NR^{13}$—*, or

more preferably

where $R^{11}$ to $R^{13}$ are independently hydrogen, a $C_1$-$C_{20}$ alkyl group or a $C_6$-$C_{20}$ aryl group.

As an exemplary embodiment, the radical having O as a binding site may be *—O—*.

As an exemplary embodiment, the radical having S as a binding site may be *—S—*, *—S—S—*,

The radical having P as a binding site may be

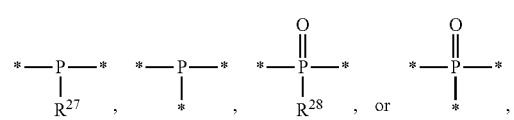

where $R^{27}$ and $R^{28}$ are independently hydrogen, a $C_1$-$C_{20}$ alkyl group, a $C_6$-$C_{20}$ aryl group, a $C_1$-$C_{20}$ alkoxy group, or a $(C_1$-$C_{20})$alkyl$(C_1$-$C_{20})$alkoxy group.

In Formula 1 above, L may be $C_1$-$C_{10}$ alkylene.
The compound represented by Formula 1 above may be a compound selected from following Structural Formulae 1 to 8:
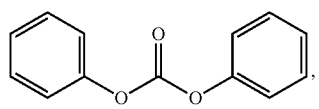 (1)
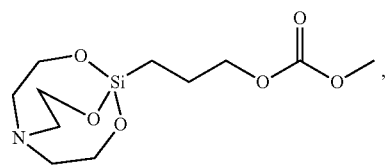 (2)
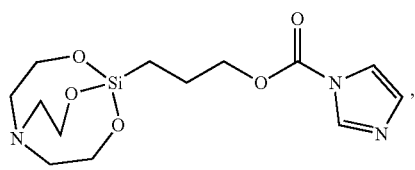 (3)
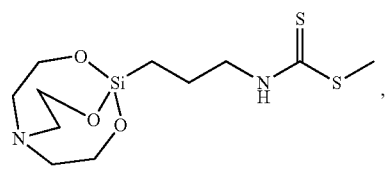 (4)
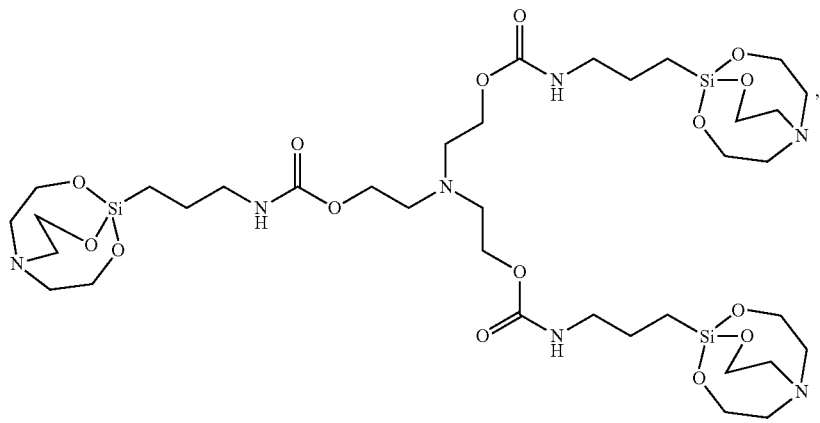 (5)
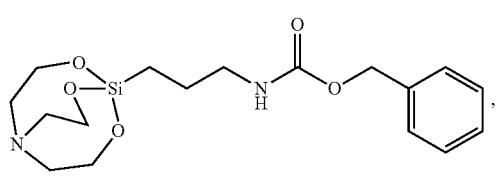 (6)
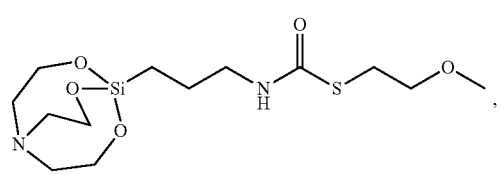 (7)

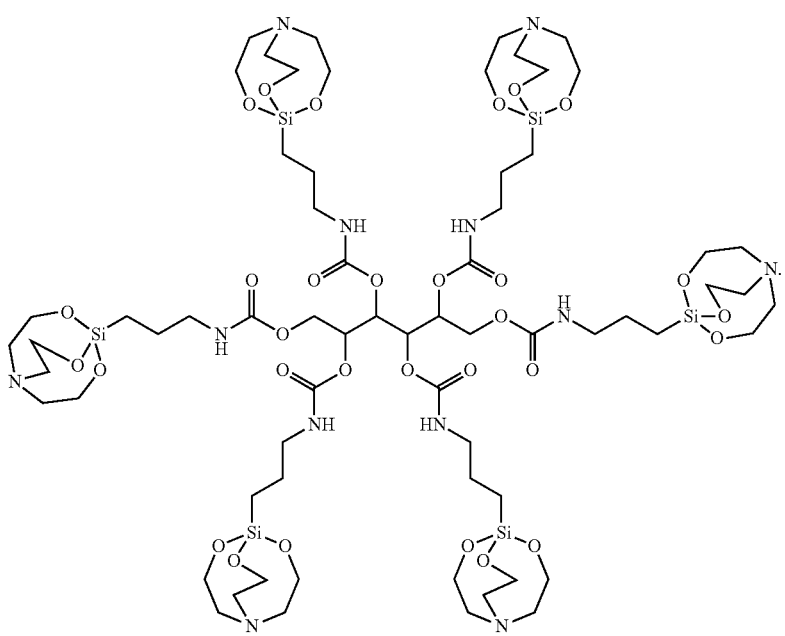

The silane compound comprising at least one silicon (Si) atom is represented by Formula 2 below:

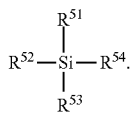

[Formula 2]

In Formula 2 above, $R^{51}$ to $R^{54}$ are independently hydrogen, a $C_1$-$C_{20}$ hydrocarbyl group, or a $C_1$-$C_{20}$ heterohydrocarbyl group, and $R^{51}$ to $R^{54}$ independently exist or two or more thereof form a ring via a heteroatom.

An etching composition according to an exemplary embodiment may further contain an ammonium salt.

An etching composition according to an exemplary embodiment may contain the compound represented by Formula 1 above in an amount of 0.001 wt % to 5 wt %, based on a total weight of the etching composition.

An etching composition according to an exemplary embodiment may contain 70 wt % to 90 wt % of phosphoric acid, 1 wt % to 20 wt % of phosphoric anhydride, 0.001 wt % to 5 wt % of the compound represented by Formula 1, 0.005 wt % to 1 wt % of the silane compound comprising at least one Si atom (excluding the compound represented by Formula 1), and a remainder of water.

As an aspect, a method for etching an insulator film using an etching composition according to an exemplary embodiment is provided.

As another aspect, a method for manufacturing a semiconductor device including the method for etching an insulator film is provided.

Still as another aspect, a compound represented by Formula 1 below is provided:

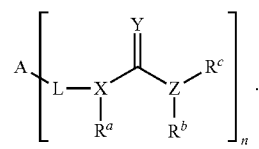

[Formula 1]

In Formula 1 above, A is an n-valent radical, where n is an integer of 1 to 3. L is a direct bond or $C_1$-$C_3$ hydrocarbylene, and Y is selected from O and S while X and Z are independently selected from N, O and S. $R^a$ and $R^b$ are independently an unshared electron pair, hydrogen, or a substituted or unsubstituted hydrocarbyl group, and $R^c$ is a substituted or unsubstituted hydrocarbyl group.

As an exemplary embodiment, $R^c$ may be $C_1$-$C_{20}$ alkyl group, $C_6$-$C_{20}$ aryl group, or a functional group represented by the following formula:

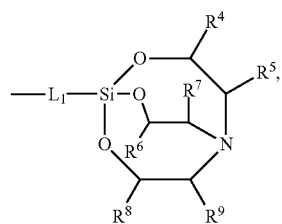

where $R^4$ to $R^9$ are independently hydrogen, a substituted or unsubstituted hydrocarbyl group, or a substituted or unsubstituted non-hydrocarbyl group, and $L_1$ is a direct bond or hydrocarbylene.

As an exemplary embodiment, $R^4$ to $R^9$ may independently be all hydrogen, and $L_1$ may be a direct bond or $C_1$-$C_5$ alkylene.

As an exemplary embodiment, A may be a monovalent radical, which is $C_1$-$C_{20}$ alkyl or $C_6$-$C_{20}$ aryl, independently existing or connected to $R^a$ via a heteroatom of O, N or S to form a ring, or a trivalent radical, which is

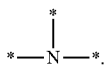

As an exemplary embodiment, A is a monovalent radical of $*-(CH_2)_pR^{10}$ (p is an integer of 1 to 3, and $R^{10}$ is hydrogen, halogen, a substituted or unsubstituted $C_1$-$C_{20}$ alkyl group, a substituted or unsubstituted $C_6$-$C_{20}$ aryl group, or a substituted or unsubstituted ($C_1$-$C_{20}$) alkyl ($C_1$-$C_{20}$) alkoxy group),

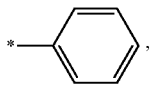

or $*-CH=CHN=$ (connected to $R^a$ via N to form a ring).

For example, the compound may be a compound represented by any one of Structural Formulae 2 to 5:

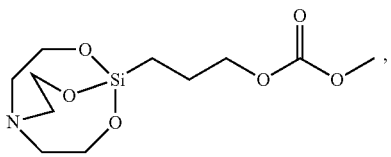

(2)

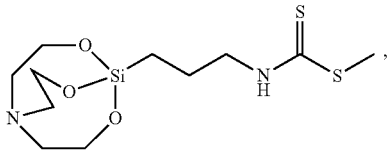

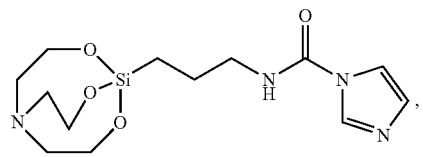

(3)

(4)

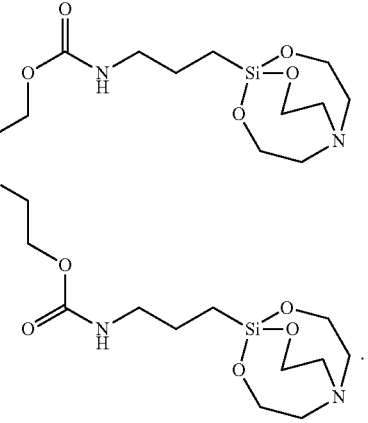

(5)

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
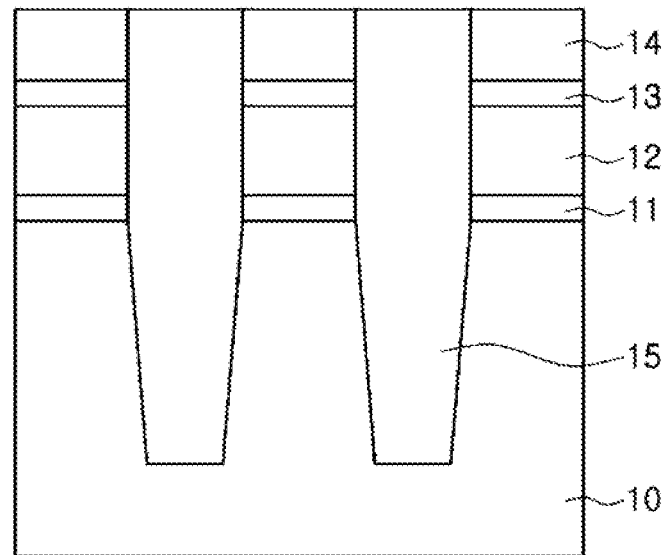
FIGS. 1 and 2 are process cross-sectional views illustrating a method for etching an insulator film according to an exemplary embodiment.

The present disclosure is to provide an etching composition, in particular, an etching composition having a high selection ratio enabling selective removal of a nitride film while minimizing an etching rate of an oxide film and having excellent storage stability.

The etching composition of the present disclosure includes phosphoric acid, phosphoric anhydride, an etching additive, and a silane compound containing at least one silicon (Si) atom, excluding the compound represented by Formula 1.

The phosphoric acid may react with silicon nitride to etch the nitride film, and react with the silicon nitride as in Formula (1) below:

$$3Si_3N_4+27H_2O+4H_3PO_4 \rightarrow 4(NH_4)_3PO_4+9SiO_2H_2O \quad (1).$$

The phosphoric acid may be, for example, an aqueous phosphoric acid solution containing phosphoric acid at a concentration of 70% to 85%, but is not limited thereto. Water used in the aqueous phosphoric acid solution is not particularly limited, but deionized water may be used.

The phosphoric acid is contained in an amount of 70 wt % to 90 wt % based on the total weight of the etching composition. When the phosphoric acid is contained in an amount of less than 70 wt %, the nitride film is not easily removed. In contrast, when the phosphoric acid is contained in an amount greater than 90 wt %, a high selection ratio of the nitride film cannot be obtained for the oxide film.

The etching composition of the present disclosure contains an etching additive. The etching additive is a compound represented by following Formula 1:

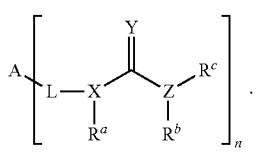

[Formula 1]

In Formula 1, Y is selected from $NR^1$, O, $PR^2$ and S, where $R^1$ to $R^2$ are independently hydrogen, halogen, a substituted or unsubstituted hydrocarbyl group, or a substituted or unsubstituted non-hydrocarbyl group. For example, the hydrocarbyl group may be a substituted or unsubstituted $C_1$-$C_{20}$ alkyl group, such as a methyl group or an ethyl group, a substituted or unsubstituted $C_6$-$C_{20}$ aryl group, such as a benzyl group, a a substituted or unsubstituted $C_1$-$C_{20}$ alkoxy group, or a substituted or unsubstituted ($C_1$-$C_{20}$) alkyl ($C_1$-$C_{20}$) alkoxy group.

In Formula 1 above, X and Z may be independently selected from N, O, P and S.

In Formula 1 above, $R^a$ to $R^c$, connected to the X and Z, may independently be an unshared electron pair, hydrogen, or a substituted or unsubstituted hydrocarbyl group. When $R^a$ to $R^c$ are a substituted or unsubstituted hydrocarbyl group, such as a $C_1$-$C_{20}$ alkyl group or a $C_6$-$C_{20}$ aryl group, or a functional group represented by the following formula:

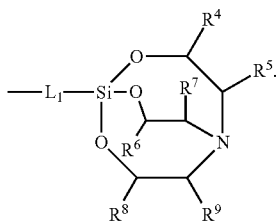

In the formula above, $R^4$ to $R^9$ may independently be hydrogen, a substituted or unsubstituted hydrocarbyl group, or a substituted or unsubstituted non-hydrocarbyl group. The hydrocarbyl or non-hydrocarbyl group may be a substituted or unsubstituted $C_1$-$C_{20}$ hydrocarbyl group, a substituted or unsubstituted $C_1$-$C_{20}$ alkoxy group, a carboxy group, a carbonyl group, a nitro group, a tri ($C_1$-$C_{20}$-alkyl) silyl group, a phosphoryl group, or a cyano group. The substituted or unsubstituted $C_1$-$C_{20}$ hydrocarbyl group may be a substituted or unsubstituted $C_1$-$C_{20}$ alkyl group or a substituted or unsubstituted $C_6$-$C_{20}$ aryl group. Although not limited, the substitution may be, for example, a substitution with a halogen. As an example, $R^4$ to $R^9$ may be all hydrogen.

$L_1$ may be a direct bond or hydrocarbylene, specifically, $C_1$-$C_{10}$ hydrocarbylene. For example, $L_1$ may be $C_1$-$C_{10}$ alkylene, more specifically, $C_1$-$C_5$ alkylene, $C_1$-$C_3$ alkylene, or the like.

As an example, $R^a$ and $R^b$ are independently an unshared electron pair, hydrogen, a substituted or unsubstituted $C_1$-$C_{20}$ alkyl group, or a substituted or unsubstituted $C_6$-$C_{20}$ aryl group, and $R^c$ is an unshared electron pair, hydrogen, a substituted or unsubstituted $C_1$-$C_{20}$ alkyl group, a substituted or unsubstituted $C_6$-$C_{20}$ aryl group, or a functional group represented by the following formula:

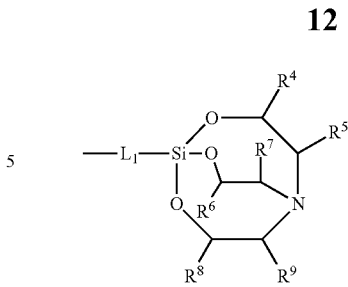

where $R^4$ to $R^9$ and $L_1$ are as defined above.

In Formula above, $L_1$ may be a direct bond or hydrocarbylene. Specifically, the $L_1$ may be $C_1$-$C_{10}$ hydrocarbylene, for example, $C_1$-$C_{10}$ alkylene, $C_1$-$C_3$ alkylene, or the like.

In Formula above, A is an n-valent radical, where n is an integer of 1 to 6. For example, A may be hydrocarbyl, hydrocarbylene, a radical having N as a binding site, a radical having O as a binding site, a radical having S as a binding site, or a radical having P as a binding site.

Specifically, A may be a monovalent hydrocarbyl group where n is 1. More specifically, A may be substituted or unsubstituted $C_1$-$C_{20}$ alkyl, such as methyl or ethyl, substituted or unsubstituted $C_6$-$C_{20}$ aryl, such as benzyl.

Further, A may be hydrocarbylene. When A is hydrocarbylene, A may independently exist or may be connected to $R^a$ via a heteroatom, such as O, N, or S, to form a ring. For example, A may be *—CH=CHN=$R^a$, a ring formed by being connected to $R^a$ via a heteroatom N.

As an example, A may be any one of a *—$(CH_2)_pR^{10}$, where p is an integer of 0 to 3, $R^{10}$ is hydrogen (p is not 0), halogen (p is not 0), a substituted or unsubstituted $C_1$-$C_{20}$ alkyl group, a substituted or unsubstituted $C_6$-$C_{20}$ aryl group, a substituted or unsubstituted ($C_1$-$C_{20}$) alkyl ($C_1$-$C_{20}$) alkoxy group.

As another example, A, as *—$(CH=CH)_mN$—, may be connected to $R^a$ via N to form a ring. The N may have a substituent, such as hydrogen, halogen, or the like. In the case of having the substituent, A may be connected to $R^a$ by a single bond, while A may be connected to $R^a$ by a double bond in absence thereof. Here, m is an integer of 1 to 3.

Specific examples of A may be *—$CH_3$,

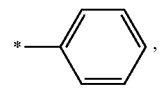 [SMILES: *c1ccccc1]

*—CH=CHN= (A is connected to $R^a$ via N to form a ring),

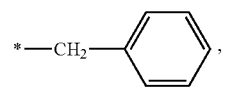

*—$(CH_2)_2$—$OCH_3$, or the like.

Further, A may be a bivalent to hexavalent radical, such as

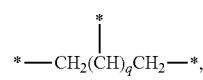

where q is an integer of 0 to 4. Specifically, when q is 0, 1, 2 and 4, A is a bivalent, trivalent, tetravalent and hexavalent radical, respectively.

A may be a radical having N as a binding site. For example, the radical having N as a binding site may be *—NR$^{11}$R$^{12}$ in the case in which n is 1; *—NR$^{13}$—*, *—NR$^{14}$CSNR$^{15}$—*, *—NR$^{16}$CONR$^{17}$—*, *—NR$^{18}$L$_2$NR$^{19}$—*, *—NR$^{20}$CONR$^{21}$L$_3$NR$^{22}$CONR$^{23}$—*, *—NR$^{24}$CONL$_4$L$_5$NCONR$^{25}$—*, or the like, in the case in which n is 2. When n is 3, the radical having N as a binding site may be

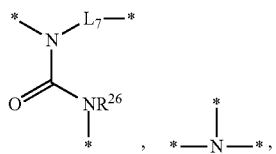

or the like, and the radical having N as a binding site may be

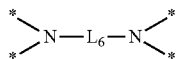

when n is 4.

In this case, R$^{11}$ to R$^{26}$ are independently hydrogen, a C$_1$-C$_{20}$ alkyl group or a C$_6$-C$_{20}$ aryl group, and L$_2$ to L$_6$ are C$_1$-C$_{20}$ alkylene, C$_6$-C$_{20}$ arylene, or R$^{31}$(OR$^{32}$)$_r$, where R$^{31}$ and R$^{32}$ are independently C$_1$-C$_{20}$ alkylene group, and r is an integer of 1 to 5. L$_7$ is a direct bond or (CH$_2$)$_s$NR$^{33}$NR$^{34}$, where R$^{33}$ and R$^{34}$ are independently hydrogen, a C$_1$-C$_{20}$ alkylene group or a C$_6$-C$_{20}$ aryl group, and s is an integer of 1 to 5.

Further, A may be a radical having O as a binding site. For example, the radical having O as a binding site may be a bivalent radical such as *—O—*.

Alternately, A may be a radical having S as a binding site. For example, the radical having S as a binding site may be a bivalent radical such as *—S—*, *—S—S—*,

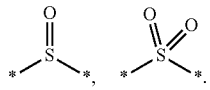

Alternately, A may be a radical having P as a binding site. For example, the radical having P as a binding site may be a bivalent or trivalent radical, such as

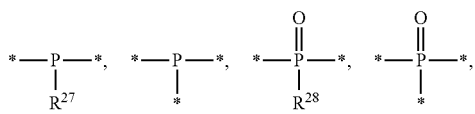

where R$^{27}$ and R$^{28}$ are independently hydrogen, a C$_1$-C$_{20}$ alkyl group, a C$_6$-C$_{20}$ aryl group, a C$_1$-C$_{20}$ alkoxy group, or a (C$_1$-C$_{20}$)alkyl(C$_1$-C$_{20}$)alkoxy group.

In Formula 1 above, Y may be selected from O, P and S, and X and Z may be independently selected from N, O, P and S.

The compound represented by Formula 1 may be, for specific example, any one compound represented by Structural Formulae 1 to 8 below:

(1)

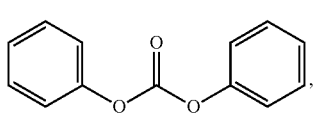

(2)

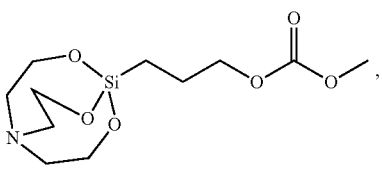

(3)

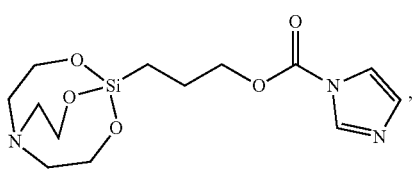

(4)

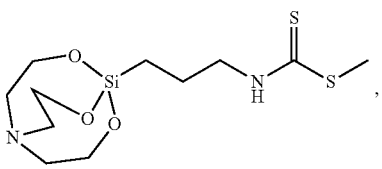

(5)

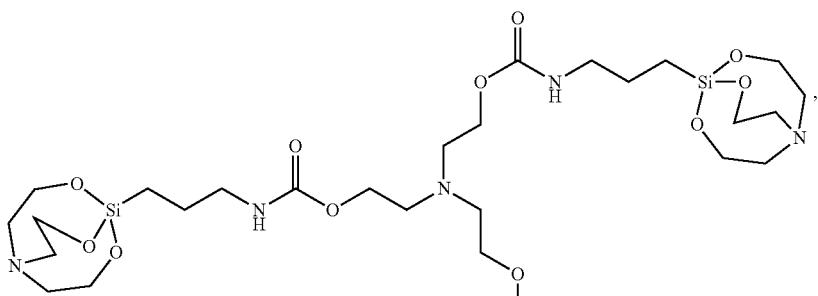

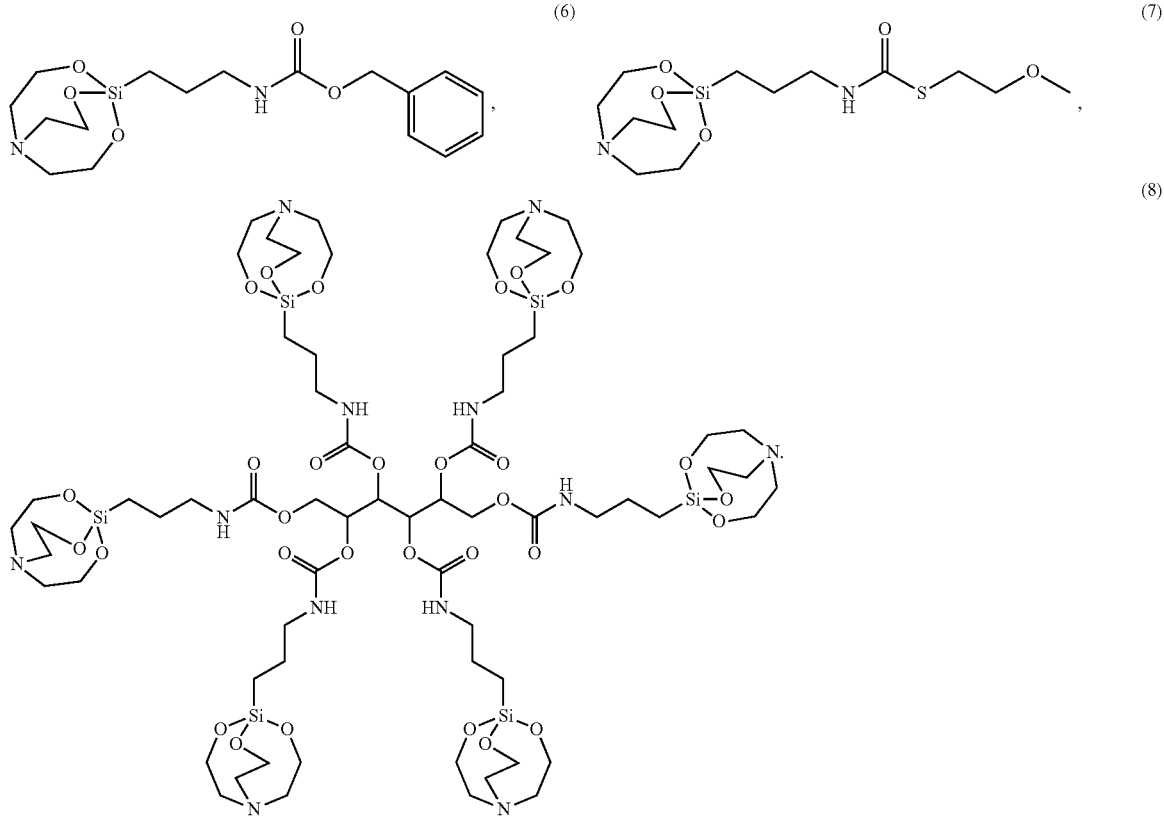

The compound of Formula 1 as above binds to a surface of the oxide film to protect the oxide film, thereby minimizing etching of the oxide film while the nitride film is etched in the etching compound. The compound of Formula 1 may also significantly increase an etching selection ratio as compared with a short chain silicon additive which has conventionally been used. Furthermore, structural stability of an active silicon-based additive in the etching composition is improved, thereby continuously maintaining an etching rate of the silicon oxide film. The compound of Formula 1 as above has a polar functional group in a molecule thereof, and thus has high solubility in a polar solution, such as water, an aqueous phosphoric acid solution, or the like, and can prevent particles from being generated during the etching process.

The compound represented by Formula 1, which can be used as an additive for the etching composition in the present disclosure, can effectively protect a silicone oxide film, even when a small amount thereof is added to the etching composition, thereby increasing etching selectivity of the nitride film to the oxide film.

The compound represented by Formula 1 may be added in an amount of 0.001 wt % to 5 wt %, based on a total weight of the etching composition. When the compound represented by Formula 1 may be added in an amount of less than 0.001 wt %, it is difficult to obtain an effect of high selectivity of the nitride film to the oxide film, whereas if the amount exceeds 5 wt %, the compound may be gelled. For example, the compound represented by Formula 1 may be added in an amount of 0.001 wt %, 0.005 wt %, 0.007 wt %, 0.03 wt %, 0.05 wt %, 0.07 wt %, 0.1 wt %, 0.15 wt % or 0.2 wt % or more, and 5 wt %, 4.5 wt %, 4 wt %, 3.5 wt %, 2.5 wt %, 2 wt %, 1 wt % or less, based on a total weight of the etching composition.

The compound represented by Formula 1 used as an additive for the etching composition is featured in low solubility. When a silane-based additive whose reasonable solubility is not ensured is used in the etching composition or if a compositional ratio is not adjusted to an appropriate level, it may result in precipitation of silicon-based particles in the etching composition and abnormal growth thereof. Such particles may remain on the silicon substrate to cause defects in a device implemented on the substrate or in failure of equipment (e.g., a filter) used in the etching or washing.

The present disclosure contains phosphoric anhydride together with the compound represented by Formula 1. Although not particularly limited, phosphoric acid, from which water is completely removed, may be used for the phosphoric anhydride. The phosphoric anhydride may be any one of pure phosphoric acid, pyrophsphoric acid, polyphosphoric acid having at least 3Ps and metaphosphoric acid. These may be used alone or in a combination of two or more.

Although not particularly limited, the phosphoric anhydride can be obtained by heating phosphoric acid at a temperature of 180° C. to 220° C. to remove water therefrom. In the present disclosure, use of the phosphoric anhydride along with the compound of Formula 1 may serve to prevent precipitation of the silane-based additives, which have not been dissolved, due to hydrolysis and polycondensation caused by a remainder of water.

Although not particularly limited, the phosphoric anhydride may be mixed with the compound of Formula 1 to be added to the aqueous phosphoric acid solution. To this end, the compound of Formula 1 is added to the phosphoric anhydride and heated at a temperature of 30° C. to 300° C. and dissolved to mix.

It is preferable that the phosphoric anhydride be contained in an amount of 1 wt % to 20 wt %. In the case of an amount less than 1 wt %, the compound of Formula 1 may not be dissolved but extracted, whereas an amount exceeding 20 wt % may reduce a selection ratio for the silicon nitride film.

The etching composition of the present disclosure can prevent particle generation and have improved storage stability by preventing silica production while improving selectivity to the nitride film by adding the compound represented by Formula 1 to prevent etching of the oxide film.

Meanwhile, in the above Formula 1, $SiO_2H_2O$ may be conventionally extracted on a surface of the oxide film and cause abnormal growth of increasing a thickness of the oxide film. In particular, when the etching of the nitride film is accumulated in the etching composition, a concentration of $SiO_2H_2O$ in the etching composition may increase. This may increase incidence of the abnormal growth. That is, abnormal growth caused by $SiO_2H_2O$ may not occur in an initial etching composition; however, as a number of the accumulation process increases, incidence of the abnormal growth increases. When the compound represented by Formula 1 according to the present disclosure is contained, however, such abnormal growth can be prevented.

The etching composition of the present disclosure contains a silane compound containing at least one Si atom. The silane compound is different from the compound of Formula 1. The silane compound may be a silane compound represented by Formula 2 below:

[Formula 2]

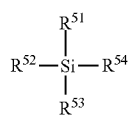

In Formula 2 above, $R^{51}$ to $R^{54}$ are independently hydrogen, $C_1$-$C_{20}$ hydrocarbyl, or $C_1$-$C_{20}$ heterohydrocarbyl, and $R^{51}$ to $R^{54}$ may independently exist or two or more thereof may forma ring, connected by a heteroelement. For example, $R^{51}$ to $R^{54}$ may be hydrogen, $C_1$-$C_{20}$ alkyl, $C_1$-$C_{20}$ heteroalkyl, or the like. In this case, the heteroelement is not particularly limited, but may be, for example, N, S, O, P, or the like.

The silane compound represented by Formula 2 may be included in an amount of 0.005 wt % to 1 wt %, based on the total weight of the etching composition.

Further, an ammonium salt may also be added to the etching composition of the present disclosure. The ammonium salt can prevent gelation of the etching composition and may be added in an amount of 0.001 wt % to 10 wt %, based on the total weight. When less than 0.001 wt % of the ammonium salt is added, an improvement of physical properties, which is reduced gelation, may be insignificant. When added in an amount of more than 10 wt %, the ammonium salt may cause the gelation.

The ammonium salt is a compound having an ammonium ion, and those conventionally used in the art may be appropriately used in the present disclosure as well. Although not particularly limited, the ammonium salt may be, for example, ammonia water, ammonium chloride, ammonium acetate, ammonium phosphate, ammonium peroxydisulfate, ammonium sulfate, ammonium fluorate, or the like. These may be used alone or in a combination of two or more.

Furthermore, the etching composition of the present disclosure may further contain an optional additive conventionally used in the art to further improve etching performance. The additive may be a surfactant, a metal ion sequestrant, a corrosion inhibitor, or the like.

In the etching composition of the present disclosure, a remainder is a solvent. The solvent may be water, but is not particularly limited thereto.

The etching composition of the present disclosure is used for selective removal of a nitride film by etching from a semiconductor device including an oxide film and the nitride film. The nitride film may include a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced oxide (PE-oxide) film, an O3-tetraethyl orthosilicate (O3-TEOS) film or combinations thereof.

An etching method involving use of the etching composition of the present disclosure may be performed by a wet etching method, for example, dipping, spraying, or the like.

Figure 2:
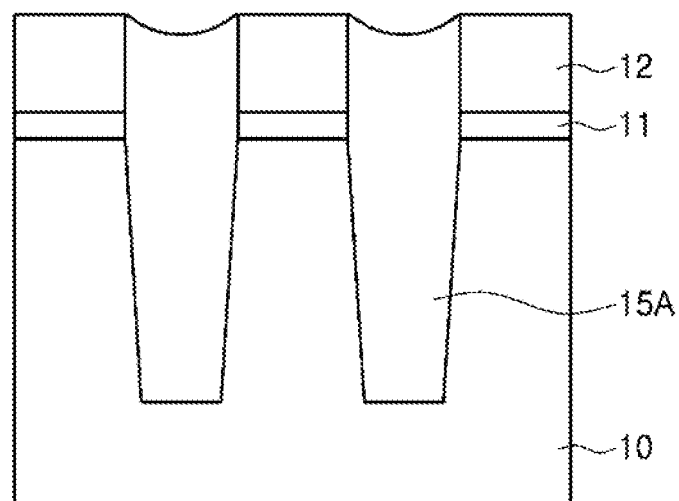

An example of an etching process using the etching composition of the present disclosure is schematized in FIGS. 1 and 2. FIGS. 1 and 2 are exemplary process cross-sectional views illustrating a device separation process of a flash memory device.

As illustrated in FIG. 1, a tunnel oxide film 11, a polysilicon film 12, a buffer oxide film 13 and a pad nitride film 14 are formed on a substrate 10 in said order, and the polysilicon film 12, the buffer oxide film 13 and the pad nitride film 14 are then selectively etched to form a trench. Subsequently, an SOD oxide film 15 is formed until the trench is gap-filled, and a CMP process is then carried out on the SOD oxide film 15 using the pad nitride film 14 as a polishing stop film.

As illustrated in FIG. 2, after the pad nitride film 14 is removed by wet etching using a phosphoric acid solution, the buffer oxide film 13 is removed in a washing process. As a result, a device separation film 15A is formed in a field area.

A temperature of the etching process may be in a range of 50° C. to 300° C., preferably 100° C. to 200° C., more preferably 156° C. to 163° C., and an appropriate temperature may be changed, if necessary, in consideration of other processes and factors.

As such, according to a method for manufacturing a semiconductor device including the etching process carried out using the etching composition of the present disclosure, selective etching of the nitride film to the oxide film is feasible when the nitride film and the oxide film are alternately stacked or mixed. In addition, stability and reliability of the process can be secured by preventing the generation of particles, which was problematic in the conventional etching process.

Accordingly, such a method may be efficiently applied to various processes requiring selective etching of the nitride film to the oxide film in the semiconductor device-manufacturing process.

EXAMPLE

Hereinafter, the present disclosure will be described in detail by way of examples. The following Examples relate to an example of the present disclosure, but the present disclosure is not limited thereto.

Synthesis Example 1

7.0 g of methyl(3-triethoxysilyl)propyl carbonate, 3.7 g of triethanolamine, 35 mL of tetrahydrofuran and 0.2 g of sodium hydroxide were added to a 100 mL round bottom flask, heated to 50° C. and stirred for 4 hours.

Tetrahydrofuran was removed under reduced pressure to obtain a white solid.

Thus-obtained white solid was subject to ethyl acetate re-slurry to synthesis 5.1 g of purified 3-(2,8,9-trioxa-5-aza-1-silabicyclo[3.3.3]undecan-1-yl)prop yl methylcarbonate (additive 2):

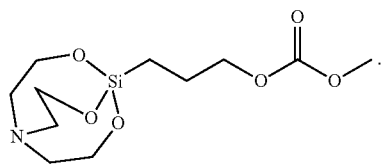 [SMILES: COC(=O)OCCC[Si]12OCCN(CCO1)CCO2]

1H-NMR (CDCl$_3$) 4.21 (t, 2H), 3.89 (t, 6H), 3.79 (s, 3H), 2.55 (t, 6H), 1.60 (m, 2H), 0.58 (t, 2H)

Synthesis Example 2

7.8 g of N-(3-(triethoxysilyl)propyl)-1H-imidazole-1-carboxamide, 3.7 g of triethanolamine, 35 mL of tetrahydrofuran and 0.2 g of sodium hydroxide were added to a 100 mL round bottom flask, heated to 50° C. and stirred for 4 hours.

Tetrahydrofuran was removed under reduced pressure to obtain a yellow solid.

Thus-obtained yellow solid was subject to ethyl acetate re-slurry to synthesis 5.5 g of purified N-(3-(2,8,9-trioxa-5-aza-1-silabicyclo[3.3.3]undecan-1-yl)propyl)-1H-imidazole-1-carboxamide (additive 3):

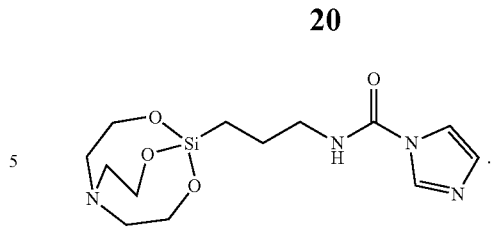

$^1$H-NMR (CDCl$_3$) 8.14 (s, 1H), 7.46 (d, 1H), 7.14 (d, 1H), 3.89 (t, 6H), 3.18 (t, 2H), 2.55 (t, 6H), 1.60 (m, 2H), 0.58 (t, 2H)

Synthesis Example 3

7.7 g of methyl(3-(triethoxysilyl)propyl)carbamodithioate, 3.7 g of triethanolamine, 35 mL of tetrahydrofuran and 0.2 g of sodium hydroxide were added to a 100 mL round bottom flask, heated to 50° C. and stirred for 4 hours.

Tetrahydrofuran was removed under reduced pressure to obtain a yellow solid.

Thus-obtained yellow solid was subject to ethyl acetate re-slurry to synthesis 5.8 g of purified methyl(3-(2,8,9-trioxa-5-aza-1-silabicyclo[3.3.3]undecan-1-yl)propyl)carbamodithioate (additive 4):

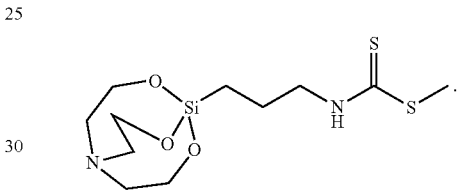

1H-NMR (CDCl$_3$) 3.89 (t, 6H), 2.87 (t, 2H), 2.55 (m, 9H), 1.60 (m, 2H), 0.58 (t, 2H)

Synthesis Example 4

22.2 g of nitrilotris(ethan-2,1-diyl) tris((3-(triethoxysilyl)propyl)carbamate, 11.1 g of triethanolamine, 35 mL of tetrahydrofuran and 0.6 g of sodium hydroxide were added to a 100 mL round bottom flask, heated to 50° C. and stirred for 4 hours.

Tetrahydrofuran was removed under reduced pressure to obtain a light yellow solid.

Thus-obtained light yellow solid was subject to ethyl acetate re-slurry to synthesis 11.1 g of purified nitrilotris(ethan-2,1-diyl) tris((3-(2,8,9-trioxa-5-aza-1-silabicyclo[3.3.3]undecan-1-yl)propyl)carbamate (additive 5):

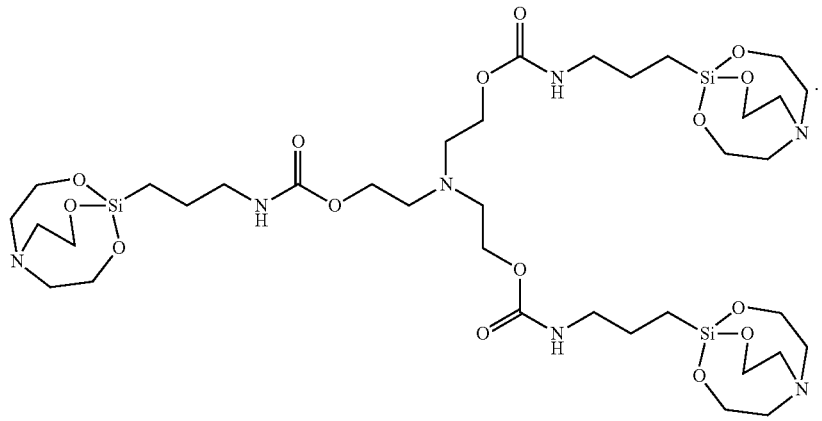 [SMILES: O=C(NCCC[Si]12OCCN(CCO1)CCO2)OCCN(CCOC(=O)NCCC[Si]12OCCN(CCO1)CCO2)CCOC(=O)NCCC[Si]12OCCN(CCO1)CCO2]

$^1$H-NMR (CDCl$_3$) 4.35 (t, 6H), 3.89 (t, 18H), 3.18 (t, 6H), 2.97 (t, 6H), 2.55 (t, 18H), 1.60 (m, 6H), 0.58 (t, 6H)

Example 1

A substrate on which a silicon oxide (SiOx) film deposited at a thickness of 500 angstroms (Å) and a silicon nitride (SiN) film deposited at a thickness of 5000 Å was prepared on a semiconductor wafer.

A mixture was prepared by dissolving 3-aminopropylsilanetriol in 120° C. phosphoric anhydride. The mixture was then added to phosphoric acid followed by adding diphenyl carbonate (additive 1) having the following structural formula to prepare an etching composition:

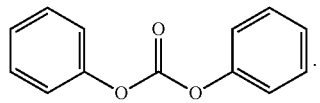 [SMILES: O=C(Oc1ccccc1)Oc1ccccc1]

As a result, as shown in Table 1, an etching composition containing 85 wt % of phosphoric acid, 0.5 wt % of 3-aminopropylsilanetriol, 10 wt % phosphoric anhydride, 0.1 wt % of additive 1 and a remainder of water was prepared.

The etching composition was added to a round flask, heated for 60 minutes to heat up to 158° C. The silicon wafer was then dipped for 720 seconds and 6000 seconds to perform an etching process.

A surface of the silicon wafer, on which a pattern was formed, was selectively etched, and thicknesses of the silicon oxide film and the silicon nitride film before and after etching were measured using Ellipsometry, thin film thickness measurement equipment (NANO VIEW, SEMG-1000). Based thereon, an etching speed of the silicon oxide film (SiO E/R, Å/min) and that of the silicon nitride film (SiN E/R, Å/min) as well as a selection ratio were calculated, and a result thereof is shown in Table 1.

The selection ratio represents a ratio of a nitride film etching speed to an oxide film etching speed, and is a value calculated by dividing a difference in the film thicknesses before and after etching by an etching time (minute).

Examples 2 to 5

The etching processes were performed in the same manner as in Example 1 except that additives 2 to 5 were used respectively, instead of additive 1. The etching speeds of the silicon oxide film and the silicon nitride film and the selection ratio were calculated and are shown in Table 1.

Comparative Example 1

3-aminopropylsilanetriol was added to phosphoric acid to prepare an etching composition.

As a result, as shown in Table 1, an etching composition containing 85 wt % phosphoric acid, 0.5 wt % of 3-aminopropylsilanetriol and a remainder of water was prepared.

Thus-prepared etching composition was used to perform an etching process in the same manner as in Example 1.

Based on the above, the etching speeds of the silicon oxide film and the silicon nitride film and the selection ratio were calculated and are shown in Table 1.

Comparative Example 2

A mixture was prepared by dissolving 3-aminopropylsilanetriol in 120° C. phosphoric anhydride. The mixture was then added to phosphoric acid to prepare an etching composition.

As a result, as shown in Table 1, an etching composition containing 85 wt % of phosphoric acid, 0.5 wt % of 3-aminopropylsilanetriol, 10 wt % phosphoric anhydride, 0.1 wt % of additive 1 and a remainder of water was prepared.

Thus-prepared etching composition was used to perform an etching process in the same manner as in Example 1.

[Etching Speeds of Silicon Oxide Film and Nitride Film and Selection Ratio]

Based on the above, the etching speeds of the silicon oxide film and the silicon nitride film and the selection ratio were calculated and are shown in Table 1

TABLE 1

| | Composition (wt %) | | | | Process temp (° C.) | SiN E/R (Å/min) | SiO E/R (Å/min) | Selection ratio |
|---|---|---|---|---|---|---|---|---|
| | 85% aq phosphoric acid | Silane compound | Phosphoric anhydride | Additive | | | | |
| Comp Ex 1 | 99.5 wt % | 0.5 wt % 3-aminopropyl-slanetriol | — | — | 158 | 68.3 | 0.32 | 213 |
| Comp Ex 2 | 89.5 wt % | | 10 wt % | — | 158 | 85.0 | 0.21 | 405 |
| Ex 1 | 89.4 wt % | | | Additive 1 0.1 wt % | 158 | 90.2 | 0.11 | 820 |
| Ex 2 | 89.4 wt % | | | Additive 2 0.1 wt % | 158 | 91.2 | 0.10 | 912 |
| Ex 3 | 89.4 wt % | | | Additive 3 0.1 wt % | 158 | 93.4 | 0.06 | 1557 |
| Ex 4 | 89.4 wt % | | | Additive 4 0.1 wt % | 158 | 94.7 | 0.04 | 2368 |
| Ex 5 | 89.4 wt % | | | Additive 5 0.1 wt % | 158 | 95.4 | 0.03 | 3180 |

As shown in Table 1 above, it can be understood that the etching compositions of Examples 1 to 5, further including an additive of Additives 1 to 5, respectively, have remarkably high etching selection ratios as compared to those of Comparative Examples 1 and 2. Further, in terms of the silicon nitride etching speed (SiN E/R), the etching compositions of Examples 1 to 5 exhibited a remarkably excellent effect as compared to those of Comparative Examples 1 and 2. As a result, it was confirmed that an etching composition optimized for an etching process of a silicon nitride film can be provided.

Based on such a result, it was confirmed that use of an etching composition including the compound of Formula 1 provided in the present disclosure improves the etching speeds of the silicon oxide film and the silicon nitride film and the selection ratio, thereby improving etching process efficiency.

[Change in Etching Composition Over Time]

The etching compositions of Comparative Example 1 and Example 1 were stored at about 70° C. for a predetermined period of time and subject to an etching test every 7 days under the same conditions. A result thereof is shown in Table 2.

TABLE 2

| | Period of storage | SiN E/R (Å/min) | SiO E/R (Å/min) | Selection ratio |
|---|---|---|---|---|
| Comparative Example 1 | — | 85.0 | 0.21 | 405 |
| | 7 days | 83.5 | 0.24 | 348 |
| | 14 days | 82.4 | 0.25 | 329.6 |
| | 21 days | 80.7 | 0.28 | 288.2 |
| Example 1 | — | 90.2 | 0.11 | 820 |
| | 7 days | 90.0 | 0.11 | 818 |
| | 14 days | 89.7 | 0.11 | 815 |
| | 21 days | 89.4 | 0.11 | 812 |

As shown in Table 2 above, the etching composition of Comparative Example 1 after 21 days showed significantly reduced etching speeds (SiN E/R) and selection ratio. Hhe etching composition of Example 1 in which Additive 1 is additionally mixed, however, showed almost no change in the etching speeds (SiN E/R and SiO E/R) and selection ratio. This indicates that the etching composition according to an exemplary embodiment of the present disclosure has not only excellent etching speeds and selection ratio but also excellent storage stability, and thus can maintain superior etching characteristics even when stored for a long period of time.

Such results also indicate that the structural stability effect of Additive 1 can maintain the function of inhibiting etching of a silicon oxide film without abnormal growth or decomposition of 3-aminopropylsilanetriol.

The etching composition according to the present disclosure has a high etching selection ratio of a nitride film to an oxide film.

In addition, use of the etching composition of the present disclosure may prevent damage of film quality of the oxide film when removing the nitride film or deterioration of electrical properties due to etching of the oxide film, as well as preventing generation of particles, thereby improving device characteristics.

While exemplary embodiments have been shown and described above, it will be apparent to those skilled in the art that modifications and variations could be made without departing from the scope of the present invention as defined by the appended claims.

What is claimed is:

1. An etching composition, comprising:
phosphoric acid, phosphoric anhydride, a compound represented by the following Formula 1, and a silane compound comprising at least one silicon (Si) atom, excluding the compound represented by Formula 1:

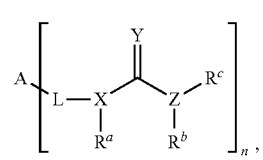

[Formula 1]

where

A is an n-valent radical, where n is an integer of 1 to 6,

L is a direct bond or hydrocarbylene,

Y is selected from $NR^1$, O, $PR^2$ and S, where $R^1$ to $R^2$ are independently hydrogen, halogen, a substituted or unsubstituted hydrocarbyl group, or substituted or unsubstituted non-hydrocarbyl group, X and Z are independently selected from N, O, P and S, and $R^a$ to $R^c$ are independently an unshared electron pair, hydrogen, or a substituted or unsubstituted hydrocarbyl group.

2. The etching composition of claim 1, wherein $R^a$ to $R^c$ are independently selected from an unshared electron pair, hydrogen, or a substituted or unsubstituted $C_1$-$C_{20}$ hydrocarbyl group, a substituted or unsubstituted $C_6$-$C_{20}$ aryl group, and a functional group represented by the following formula:

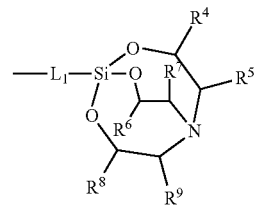

where $R^4$ to $R^9$ are independently hydrogen, a substituted or unsubstituted hydrocarbyl group, or a substituted or unsubstituted non-hydrocarbyl group, and $L_1$ is a direct bond or hydrocarbylene.

3. The etching composition of claim 2, wherein $R^4$ to $R^9$ are all hydrogen.

4. The etching composition of claim 2, wherein the $L_1$ is $C_1$-$C_{10}$ alkylene.

5. The etching composition of claim 1, wherein A is hydrocarbyl, hydrocarbylene, a radical having N as a binding site, a radical having 0 as a binding site, a radical having S as a binding site, or a radical having P as a binding site.

6. The etching composition of claim 1, wherein A is:
a monovalent radical, which is $C_1$-$C_{20}$ alkyl or $C_6$-$C_{20}$ aryl, independently existing or connected to $R^a$ via a heteroatom of O, N or S to form a ring;
a bivalent to hexavalent radical, which is

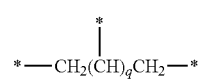

(q is an integer of 0 to 4);
a radical having N as a binding site, which is *—$NR^{11}R^{12}$, *—$NR^{13}$—*,

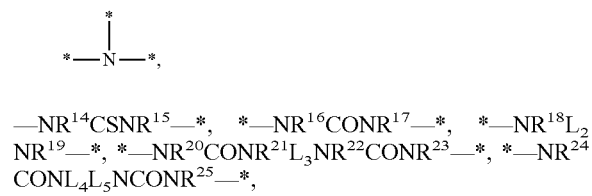

—NR$^{14}$CSNR$^{15}$—*, *—NR$^{16}$CONR$^{17}$—*, *—NR$^{18}$L$_2$NR$^{19}$—*, *—NR$^{20}$CONR$^{21}$L$_3$NR$^{22}$CONR$^{23}$—*, *—NR$^{24}$CONL$_4$L$_5$NCONR$^{25}$—*,

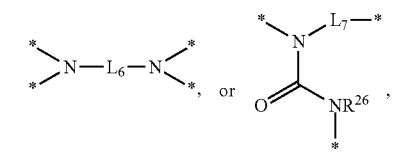

(R$^{11}$ to R$^{26}$ are independently hydrogen, a C$_1$-C$_{20}$ alkyl group or a C$_6$-C$_{20}$ aryl group; L$_2$ to L$_6$ are C$_1$-C$_{20}$ alkylene, C$_6$-C$_{20}$ arylene, or R$^{31}$(OR$^{32}$)$_r$ (R$^{31}$ and R$^{32}$ are independently C$_1$-C$_{20}$ alkylene, and r is an integer of 1 to 5); L$_7$ is a direct bond or (CH$_2$)$_s$NR$^{33}$NR$^{34}$ (R$^{33}$ and R$^{34}$ are independently hydrogen, a C$_1$-C$_{20}$ alkyl group or a C$_6$-C$_{20}$ aryl group, and s is an integer of 1 to 5);

a radical having O as a binding site, which is *—O—*;
a radical having S as a binding site, which is *—S—*, *—S—S—*,

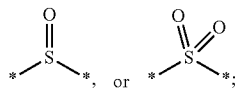

or a radical having P as a binding site, which is

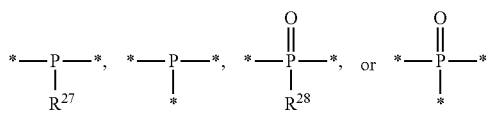

(R$^{27}$ and R$^{28}$ are independently hydrogen, a C$_1$-C$_{20}$ alkyl group, a C$_6$-C$_{20}$ aryl group, a C$_1$-C$_{20}$ alkoxy group, or a (C$_1$-C$_{20}$) alkyl (C$_1$-C$_{20}$) alkoxy group).

7. The etching composition of claim 1, wherein A is *—(CH$_2$)$_p$R$^{10}$ (p is an integer of 0 to 3, R$^{10}$ is hydrogen (p is not 0), halogen (p is not 0), a substituted or unsubstituted C$_1$-C$_{20}$ alkyl group, a substituted or unsubstituted C$_6$-C$_{20}$ aryl group, a substituted or unsubstituted (C$_1$-C$_{20}$) alkyl (C$_1$-C$_{20}$) alkoxy) group), *—(CH=CH)$_m$N= (which is connected to R$^a$ via N to form a ring, and m is an integer of 1 to 3),

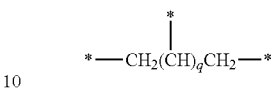

(q is an integer of 1 to 4), *—NR$^{11}$R$^{12}$ (R$^{11}$ and R$^{12}$ are independently hydrogen, a C$_1$-C$_{20}$ alkyl group or a C$_6$-C$_{20}$ aryl group), *—NR$^{13}$—*(R$^{13}$ is independently hydrogen, a C$_1$-C$_{20}$ alkyl group or a C$_6$-C$_{20}$ aryl group), or

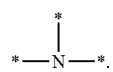

8. The etching composition of claim 1, wherein A is *—CH$_3$,

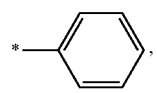

*—CH=CHN= (which is connected to R$^a$ via N to form a ring),

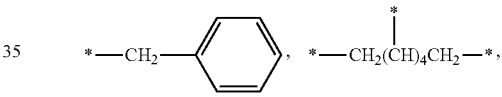

*—(CH$_2$)$_2$—OCH$_3$, or

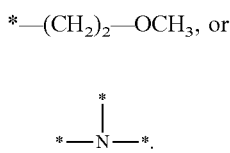

9. The etching composition of claim 1, wherein L is C$_1$-C$_{10}$ alkylene.

10. The etching composition of claim 1, wherein the compound represented by Formula 1 is selected from following Structural Formulae 1 to 8:

(1)

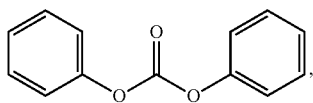

(2)

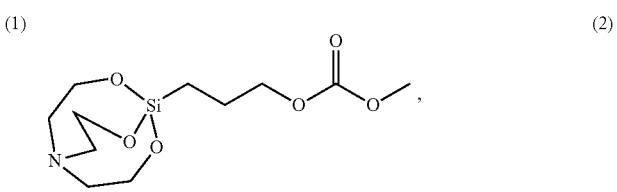

(3)

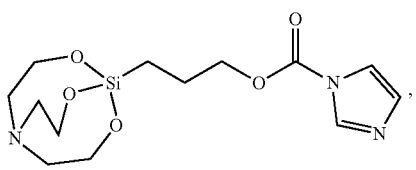

(4)

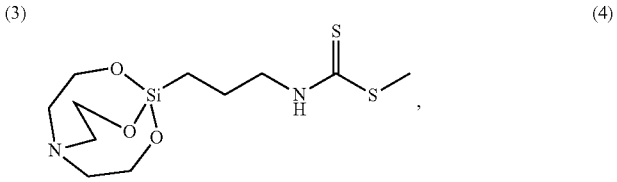

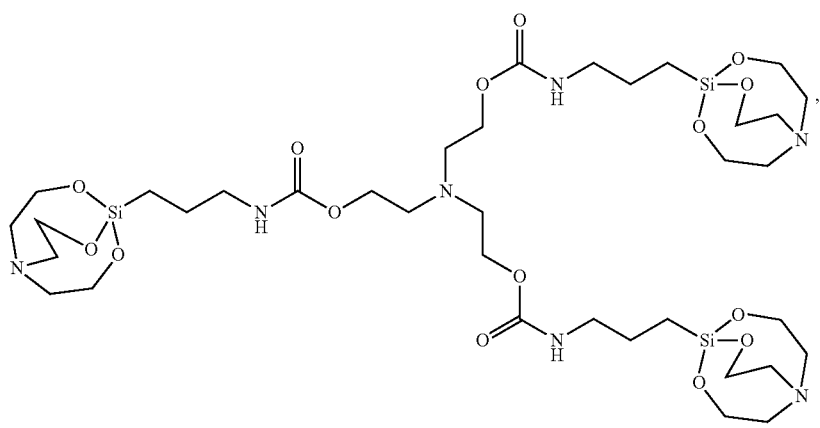

(5)

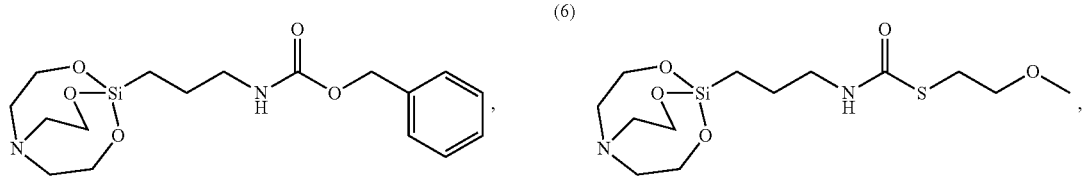

(6), (7)

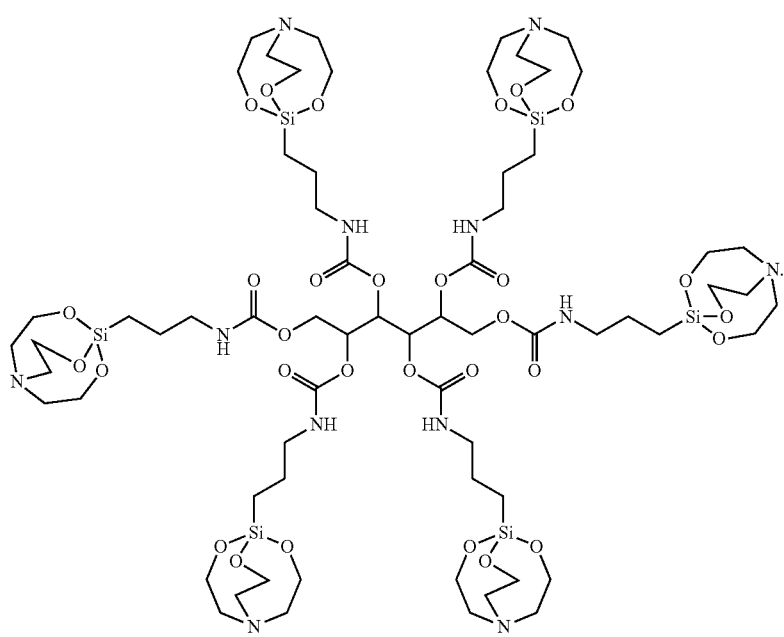

(8)

11. The etching composition of claim 1, wherein the silane compound comprising at least one silicon (Si) atom is represented by Formula 2 below:

[Formula 2]

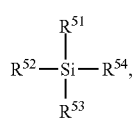

wherein, in Formula 2,
$R^{51}$ to $R^{54}$ are independently hydrogen, a $C_1$-$C_{20}$ hydrocarbyl group, or a $C_1$-$C_{20}$ heterohydrocarbyl group, and $R^{51}$ to $R^{54}$ independently exist or two or more thereof form a ring via a heteroatom.

12. The etching composition of claim 1, wherein the etching composition comprises the compound represented by Formula 1 in an amount of 0.001 wt % to 5 wt %, based on a total weight of the etching composition.

13. The etching composition of claim 1, wherein the etching composition comprises 70 wt % to 90 wt % of phosphoric acid, 1 wt % to 20 wt % of phosphoric anhydride, 0.001 wt % to 5 wt % of the compound represented by Formula 1, 0.005 wt % to 1 wt % of the silane compound comprising at least one Si atom (excluding the compound represented by Formula 1), and a remainder of water.

14. A method for manufacturing a semiconductor device, comprising etching an insulator film, using the etching compound of claim 1.

* * * * *